United States Patent [19]

Drumm et al.

[11] Patent Number: 5,799,170
[45] Date of Patent: Aug. 25, 1998

[54] SIMPLIFIED BUFFER MANIPULATION USING STANDARD REPOWERING FUNCTION

[75] Inventors: Anthony DeGroff Drumm; Robert Lowell Kanzelman; Bruce George Rudolph, all of Rochester, Minn.

[73] Assignee: International Business Machines Corporation, Armonk, N.Y.

[21] Appl. No.: 666,696

[22] Filed: Jun. 18, 1996

[51] Int. Cl.⁶ .................................................. H01L 21/70
[52] U.S. Cl. ................................ 395/500; 364/490
[58] Field of Search .................... 364/488, 489, 364/490, 491, 578; 395/500

[56] References Cited

U.S. PATENT DOCUMENTS

| | | |
|---|---|---|
| 4,488,267 | 12/1984 | Harrison. |
| 4,811,237 | 3/1989 | Putatunda et al. |
| 5,191,541 | 3/1993 | Landman et al. ............. 364/489 |
| 5,402,356 | 3/1995 | Schaefer et al. |
| 5,410,491 | 4/1995 | Minami. |
| 5,438,524 | 8/1995 | Komoda. |
| 5,513,119 | 4/1996 | Moore et al. ............... 364/491 |
| 5,563,800 | 10/1996 | Matsumoto et al. ........ 364/489 |
| 5,590,050 | 12/1996 | Okuda ....................... 364/490 |
| 5,625,567 | 4/1997 | Mankin et al. ............. 364/490 |
| 5,638,291 | 6/1997 | Li et al. .................... 364/490 |
| 5,663,889 | 9/1997 | Wakita ...................... 364/490 |

*Primary Examiner*—Kevin J. Teska
*Assistant Examiner*—Dan Fiul
*Attorney, Agent, or Firm*—Schmeiser, Olsen & Watts; Michael F. Hoffmann

[57] ABSTRACT

A simple system and method is disclosed that provides for the identification and removal of unnecessary buffers in a logic circuit. A special pseudo-buffer is added to the library and identified as a buffer cell with zero area. In addition, a feedthrough delay rule is associated with the pseudo-buffer such that it is treated by a timing system as a wire with no delay through which all electrical properties pass. An existing repowering function will then consider the pseudo-buffer as a replacement choice when attempting to select an optimal power level. If the pseudo buffer is chosen, it can be easily removed from the circuit at some time thereafter.

24 Claims, 6 Drawing Sheets

SIMPLIFIED BUFFER MANIPULATION USING STANDARD REPOWERING FUNCTION

FIELD OF THE INVENTION

The present invention relates to logic synthesis tools. More particularly, the present invention relates to a simplified method and system of adding or removing logic buffers in a logic circuit layout.

BACKGROUND OF THE INVENTION

Since the beginning of the computer era, integrated circuit (IC) manufacturers have sought to build smaller and more efficient integrated circuit chips that contain an increasing number of devices. Because the designing of IC chips is so complex, a programmed data processor is essential. The most common method of designing logic circuits for placement on IC chips is done with the use of computer systems and software that utilize CAD (Computer Aided Design) tools. A particular component that allows for the efficient design, checking and testing of very large scale integrated circuits (VLSI) is referred to as a logic synthesis tool.

A logic synthesis tool takes as input a functional description of a logic circuit, typically written in a language such as VHDL, and then converts it into a technology level description that a chip foundry can use to actually build the chip. The output of the logic synthesis tool is referred to as a net list, which is actually a list of cells from a technology library and the necessary interconnections between the cells. Thus, the output of the logic synthesis tool may be regarded as a template for the fabrication of the physical embodiment of the integrated circuit.

In addition to planning for the physical layout of an IC, CAD tools must also deal with the timing constraints that are required throughout the circuitry. Timing tools, such as IBM's "EinsTimer" system, provide timing analysis to circuit layouts by working in conjunction with the synthesis tools. Physical changes, based on this analysis can then be implemented to achieve desired timing constraints. A known method of controlling timing throughout the circuit involves the use of buffers, or buffer cells. A buffer is a single-input, single-output noninverting circuit element, sometimes implemented as a pair of inverters connected in series. Buffers are often used to take the load off of time-critical nets by changing the capacitance associated with that net. Because the capacitive load dictates the time required to charge a wire, and the amount of time for a gate to switch or a signal to propagate along a wire, buffers can be utilized to improve timing. For example, if the logic circuit includes an "AND" gate that has multiple output lines (i.e., sinks), certain output lines may require a signal earlier or later than another output line. An output line that requires the signal sooner may be referred to as a critical sink, while others that do not require this signal until a later time may be referred to as non-critical sinks. By placing one or more buffers along the non-critical sinks, the critical sink will have decreased capacitance and therefore charge faster, and therefore deliver a signal faster. Buffers may also be used to reduce RC delay on long wires by splitting a long wire into two smaller wires. Resistance and capacitance are proportional to the length of a wire. By reducing both resistance and capacitance by half, RC delay is reduced to a fourth of the original RC delay. Numerous methods of buffer usage are known throughout the industry.

One of the problems associated with the insertion of buffers to manipulate timing is the fact that estimates of capacitive load and resistance may be inaccurate at the time the buffers are being inserted into the circuit design. Thus, over or underestimating the capacitive load of a particular circuit may mean that buffers placed into the circuit are not required. Unfortunately, this may not become evident until a later time (e.g., after placing and routing the circuit) when removing the buffers becomes too expensive and inefficient. In addition, later changes to the circuit may invalidate prior decisions to insert buffers thereby resulting in unnecessary buffer cells. Because buffers take up space and consume power, it is advantageous to leave out the buffers when not needed. Unfortunately, until now, there has been no efficient way for removing buffers. Therefore, without a way of efficient and frequent examination and removal of buffers, logic synthesis tools are limited in their capabilities.

SUMMARY OF THE INVENTION

The present invention provides a system and method for examining and removing unnecessary buffers in a circuit layout using existing technology found within logic synthesis tools and timing systems. Efficient buffer removal is accomplished by first defining a pseudo-buffer for placement into a technology library where it is identified as a buffer cell with zero area. The pseudo-buffer is defined with a feedthrough delay rule such that the buffer is modeled as a wire with no delay through which all electrical characteristics pass. Thus, when an existing timing and technology correction scenario is run on the circuit, the repowering function will access the technology library and include the pseudo-buffer as a replacement choice for each buffer in the logic circuit. If the repowering function determines that the pseudo-buffer is the best choice, it will be inserted. The pseudo-buffers can then easily be removed at a later time from the logic circuit.

It will also be possible to "seed" a logic circuit with pseudo-buffers so that the repowering function can determine whether or not each of the pseudo-buffers should be replaced by a real buffer from the technology library.

It is therefore an advantage of the present invention to provide a simple means of identifying and eliminating unnecessary buffers from a logic circuit design.

It is a further advantage of the present invention to provide a buffer removal system and method that do not require additional programming to identify unnecessary buffers.

It is a further advantage of the present invention to utilize existing feedthrough rules to define a pseudo-buffer.

It is a further advantage of the present invention that buffer removal becomes a choice any time the power level of a buffer is adjusted.

It is a further advantage of the present invention that any enhancements to an existing repowering function apply to the buffer removal and insertion function by default.

It is a further advantage of the present invention to provide a method of performing buffer reinsertion without adding any new software routines.

It is a further advantage of the present invention to preserve existing wire information and data after buffer removal by leaving the original buffer wires in place and adding a small wire between the original buffer pins.

DESCRIPTION OF THE PREFERRED EMBODIMENT

Overview:

As discussed in the Background section, buffers, or buffer cells are commonly used to manipulate the timing aspects of a logic circuit by changing the capacitive characteristics of the circuit. Buffer cells are particularly relied upon by automated logic design tools (i.e., logic synthesis tools and timing systems) for creating complex circuits with critical timing constraints. Logic synthesis typically adds buffers during the "timing and technology correction step," which involves examining and modifying the circuitry (i.e., altering logic devices and re-routing wiring) to meet the required specifications.

A related component of the timing and technology correction step is a complex function called "repowering." Repowering is a process whereby an optimal power level for each cell is calculated and selected based upon various factors including size, speed, and load capability. In its simplest form, repowering works by replacing a cell with all valid matching cells of different power levels and testing the effects on the circuit. The best match is then used. All of the matching cells are stored in a technology library. Repowering is typically done as part of every timing and technology correction transformation. A transformation and repowering example are illustrated in detail below with regard to FIGS. 4–6.

Some of today's more advanced logic synthesis tools and timing systems include the ability to model single-input/single-output blocks as "feedthroughs," meaning such blocks are essentially treated as a wire with no delay and through which all electrical properties (e.g., capacitance) are passed. Examples of such systems include IBM's "BooleDozer" logic synthesizer and "EinsTimer" timing analyzer. This capability allows for the modeling of nonfunctional blocks that can be used for various reasons including acting as break-points to bound the extent of boolean optimization. The present invention operates by applying the rules associated with feedthroughs to a special buffer cell called a pseudo-buffer. As described below, this adaptation allows the repowering function to automatically identify and remove unnecessary buffer cells in a logic circuit. It should be recognized that for the purposes of this disclosure, "logic synthesis" is defined broadly to include timing as well as logic manipulation.

Figure 1:
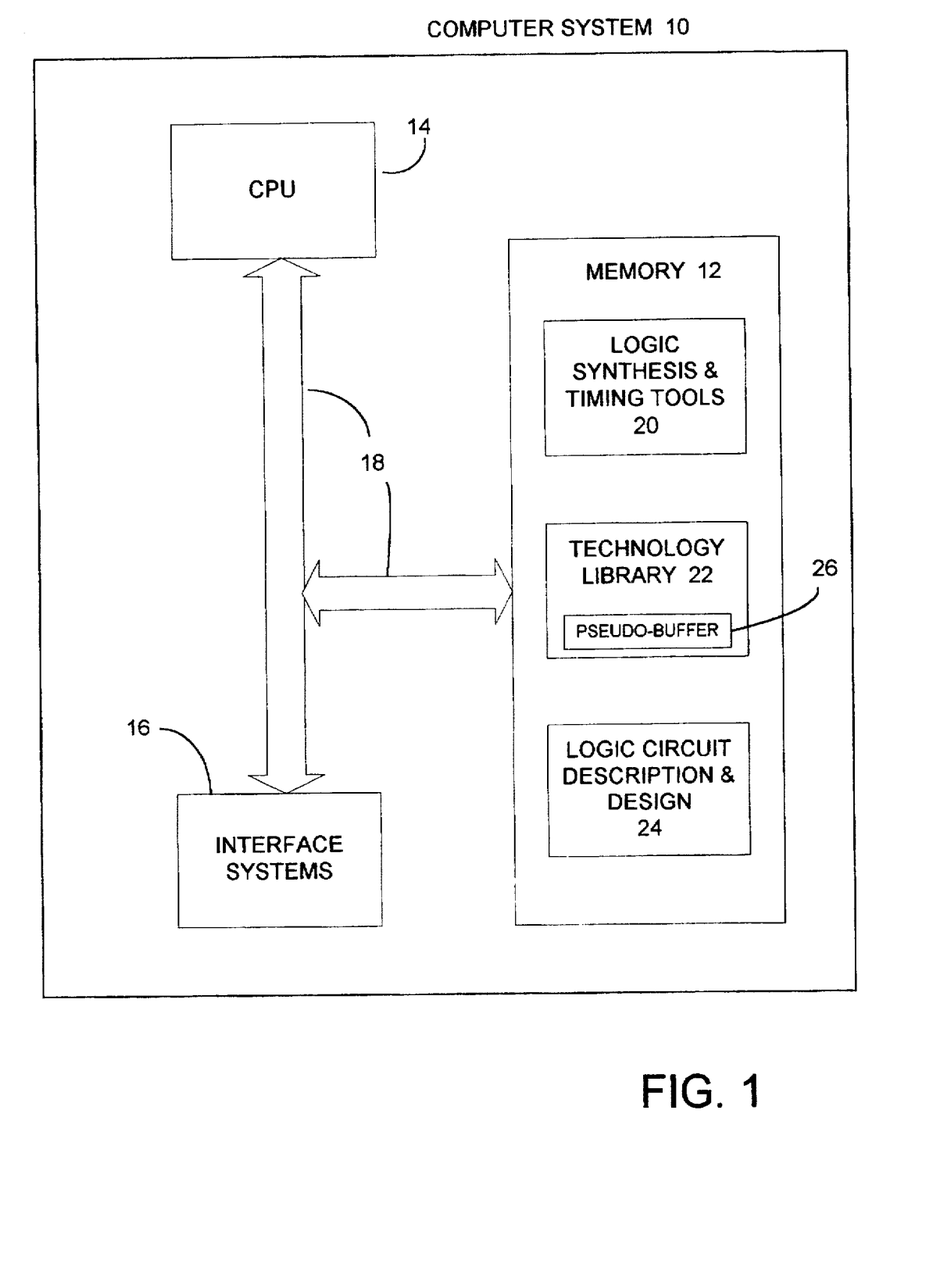
FIG. 1 is a block diagram of the computer system of the present invention.

Detailed Description:

Referring now to the drawings, FIG. 1 depicts a computer system of the present invention. Those skilled in the art will appreciate that the mechanisms and apparatus of the present invention apply equally to any computer system, regardless of whether the computer system is a complicated multi-user computing apparatus or a single user workstation. As shown in FIG. 1, computer system 10 comprises main or central processing unit (CPU) 14 connected to memory 12 and interface systems 16 via an interface bus 18. Although computer system 10 is shown to contain only a single main CPU and a single system bus, it should be understood that the present invention applies equally to computer systems that have multiple CPU's and to computer systems that have multiple buses that each perform different functions in different ways.

Interface systems 16 may involve complex input/output (I/O) systems that include separate, fully programmed microprocessors or may involve simple I/O adapters to perform similar functions. Interface systems 16 may include terminal interfaces, network interfaces, mass storage interfaces, or any other known interface systems.

Memory 12 includes logic synthesis and timing tools 20, a technology library 22 that includes a pseudo-buffer, and logic circuit descriptions 24. Logic circuit descriptions 24 may be stored in any recognized format, such as VHDL, and provide the functional description and timing requirements of the desired circuit. The logic synthesis and timing tools 20 are software programs that transform functional descriptions and timing requirements of a desired logic circuit into a net list of cells, which can be used as a blueprint to build the actual integrated circuit chip. These tools 20 include a repowering mechanism that examines each cell of a circuit and tests to see if the cell should be replaced by a different one to increase efficiency. The technology library 22 provides the logic synthesis and timing tools with various predesigned cells for use during repowering as well as during the building of the actual logic circuit.

Within the technology library is pseudo-buffer 26. Pseudo-buffer 26 is identified as a buffer with zero area and has a feedthrough delay rule associated with it such that it is treated by the timing tool as though it was a wire with no delay through which all electrical properties pass. By adding a pseudo-buffer to the library, an extra buffer cell choice for repowering is provided. If repowering decides that the pseudo-buffer is the best choice for replacing an existing real buffer, then the pseudo-buffer can easily be removed later. In addition, a circuit may be "seeded" with pseudo-buffers so that repowering will insert real buffers if deemed appropriate as the most efficient power level.

Figure 2:
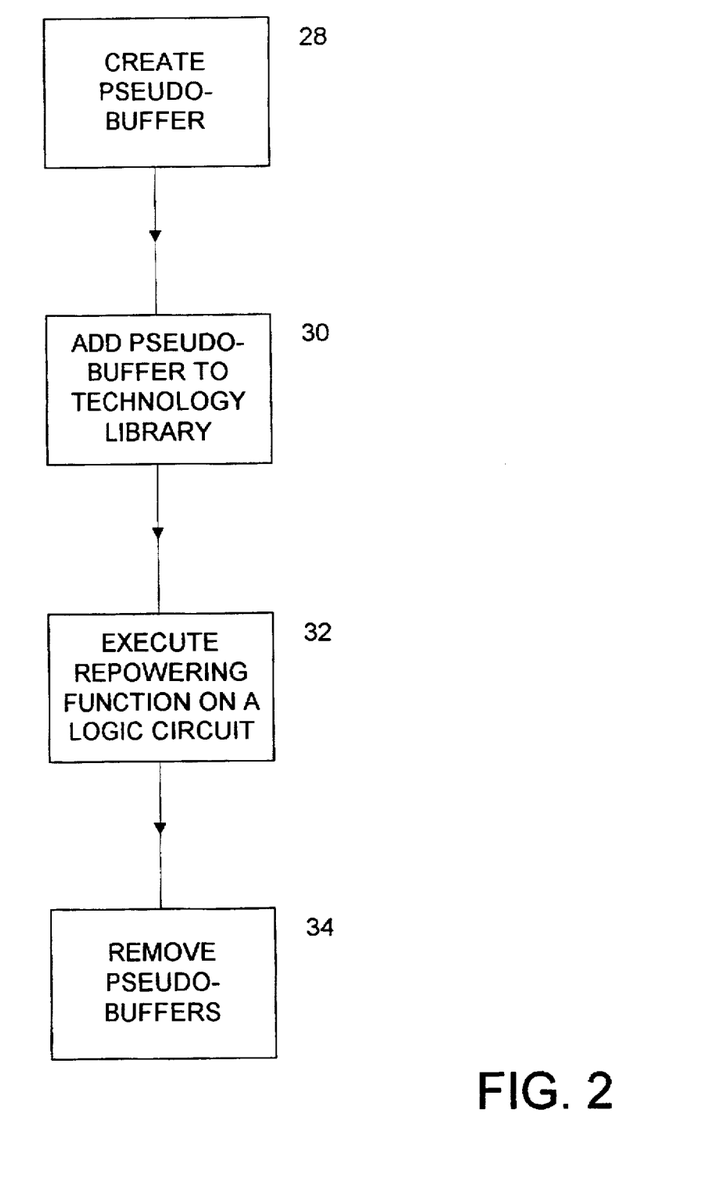
FIG. 2 is a flow diagram that shows steps used to carry out the method of buffer removal of the present invention, according to the preferred embodiment.

Referring now to FIG. 2, a block diagram is shown depicting a method of identifying and removing unnecessary buffer cells. The first step 28, is to create a pseudo-buffer that is defined with a feedthrough delay rule such that the pseudo-buffer is treated as though it were a wire with no delay and through which all electrical properties (e.g., capacitance) are passed. The next step 30, is to add the pseudo-buffer to the technology library and identify it as a buffer cell with zero area. Next, a repowering function of a logic synthesis tool is executed on a logic circuit 32. This may be done during the running of an existing timing and technology correction that accesses the technology library and includes the pseudo-buffer as a replacement choice for each buffer in the logic circuit. The final step 34 is to remove all of the pseudo-buffers inserted into the logic circuit during the execution of the repowering function. The removal of each pseudo-buffer may be accomplished simply by moving all sinks of the output net to the input net. This may also be achieved by keeping the existing buffer wires in place, removing the pseudo-buffer, and adding a small wire between the original buffer pins.

By adding the pseudo-buffer into the technology library, an extra choice for repowering is provided. This is significant in that repowering is performed during nearly all timing and technology correction transformations since the proper use of power levels is key to correctly evaluating the effectiveness of the transformation. The advantages of this method of identifying and removing unnecessary buffers include the fact that it is simple because it uses an existing and required procedure (repowering). In addition, any enhancement to the repowering function is automatically applied to the buffer removal function. In summary, this method improves the granularity of the system since buffer removal becomes a choice anytime the power level of a buffer is adjusted.

Figure 3:
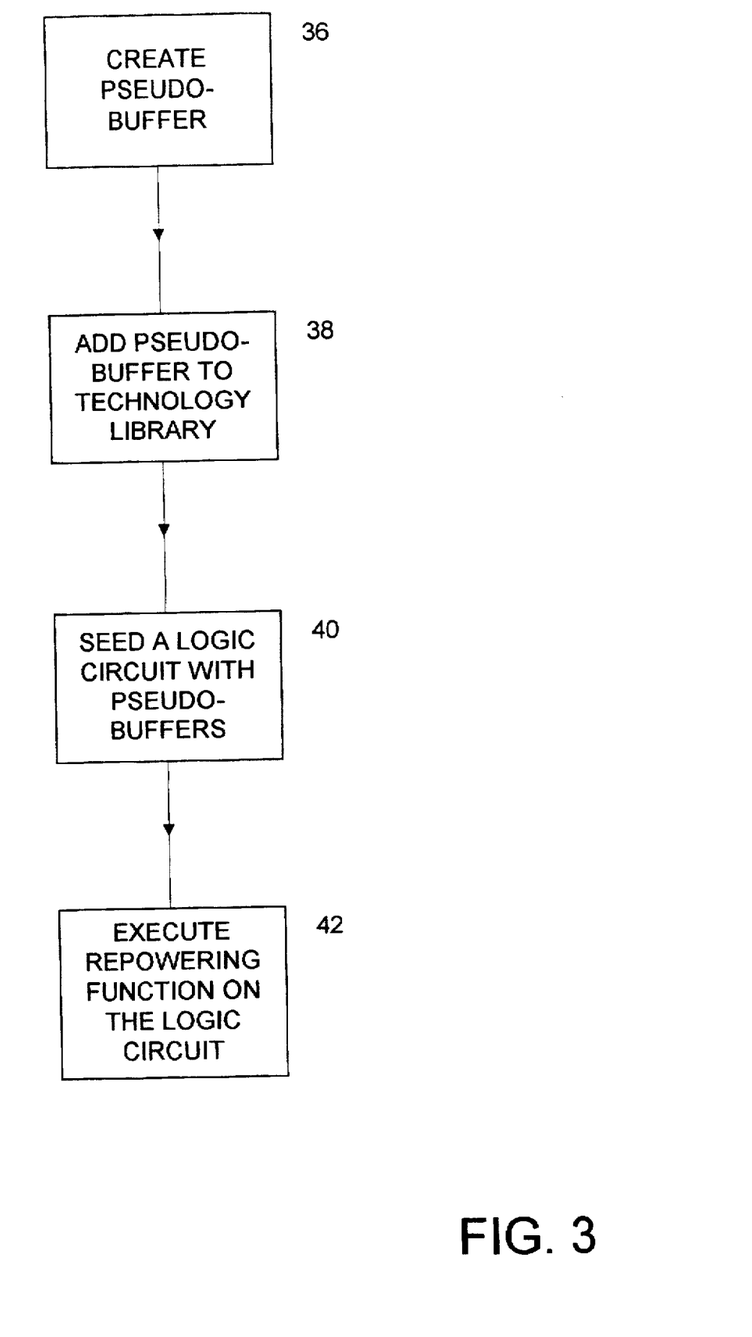
FIG. 3 is a flow diagram that shows steps used to carry out the method of buffer insertion of the present invention, according to the preferred embodiment.

Referring now to FIG. 3, a method for inserting buffers is depicted. The first two steps are the same as were discussed to FIG. 2. That is, create a pseudo-buffer using a feedthrough delay rule, and add the pseudo-buffer to the technology library. The next step 40 involves seeding a logic circuit with pseudo buffers. Finally, step 42 involves executing the repowering function on the logic circuit to potentially replace the pseudo-buffers with real buffers from the technology library at the appropriate power levels. In other words, pseudo-buffers can be experimentally located at various places in a circuit where buffers may be desirable. The repowering function can then insert real buffers at those locations by selecting a real buffer power level, if it is determined that a real buffer is required. This may become especially useful after routing to retune the circuit with the least disruption of physical layout information. For instance, pseudo-buffers can be added at several points along a wire letting repowering select which location provides the best improvement.

Figure 4:
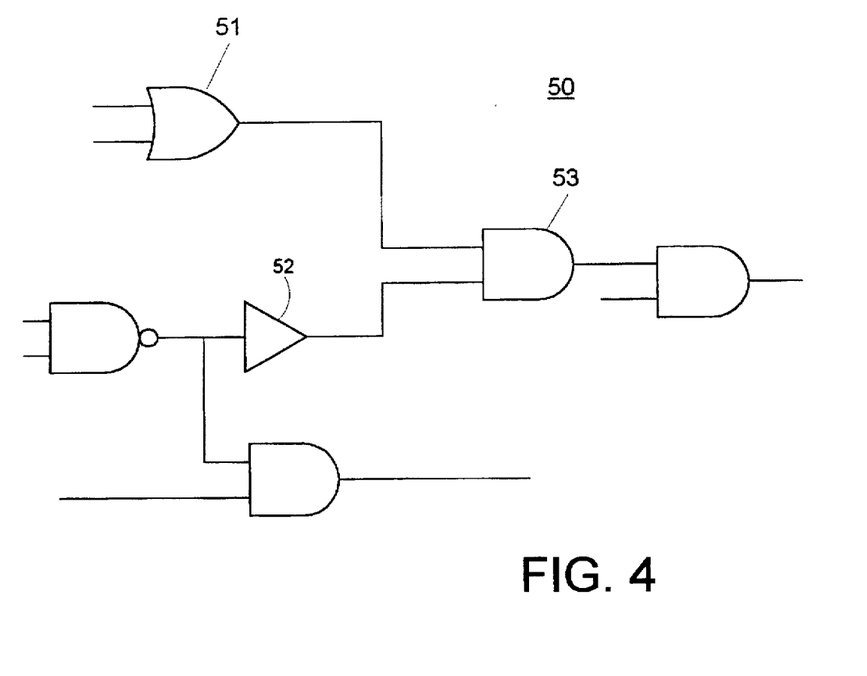
FIG. 4 is a logic circuit prior to any transformation.
Figure 5:
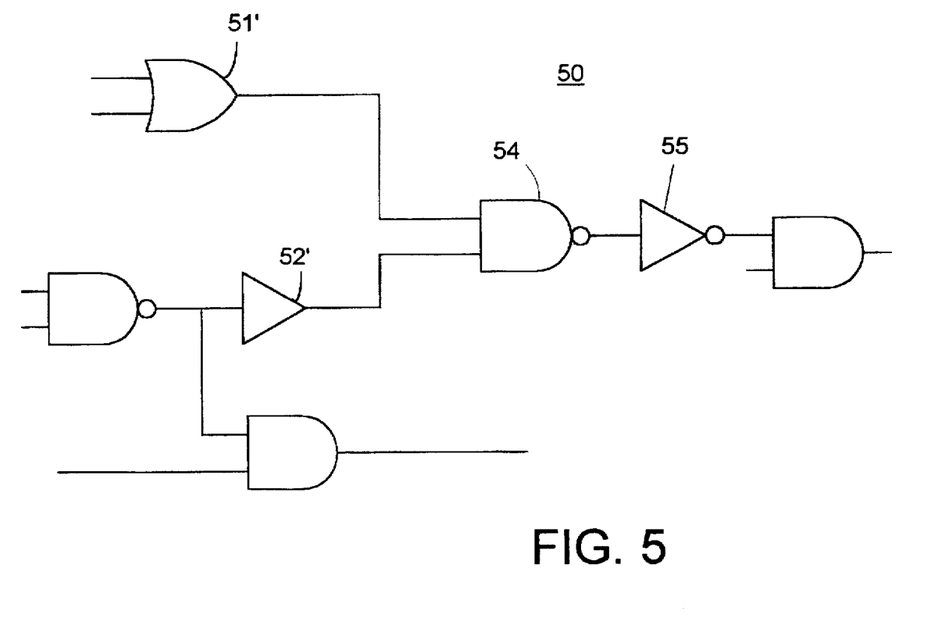
FIG. 5 is the logic circuit of FIG. 4 after a transformation in which a buffer and OR gate have been repowered.
Figure 6:
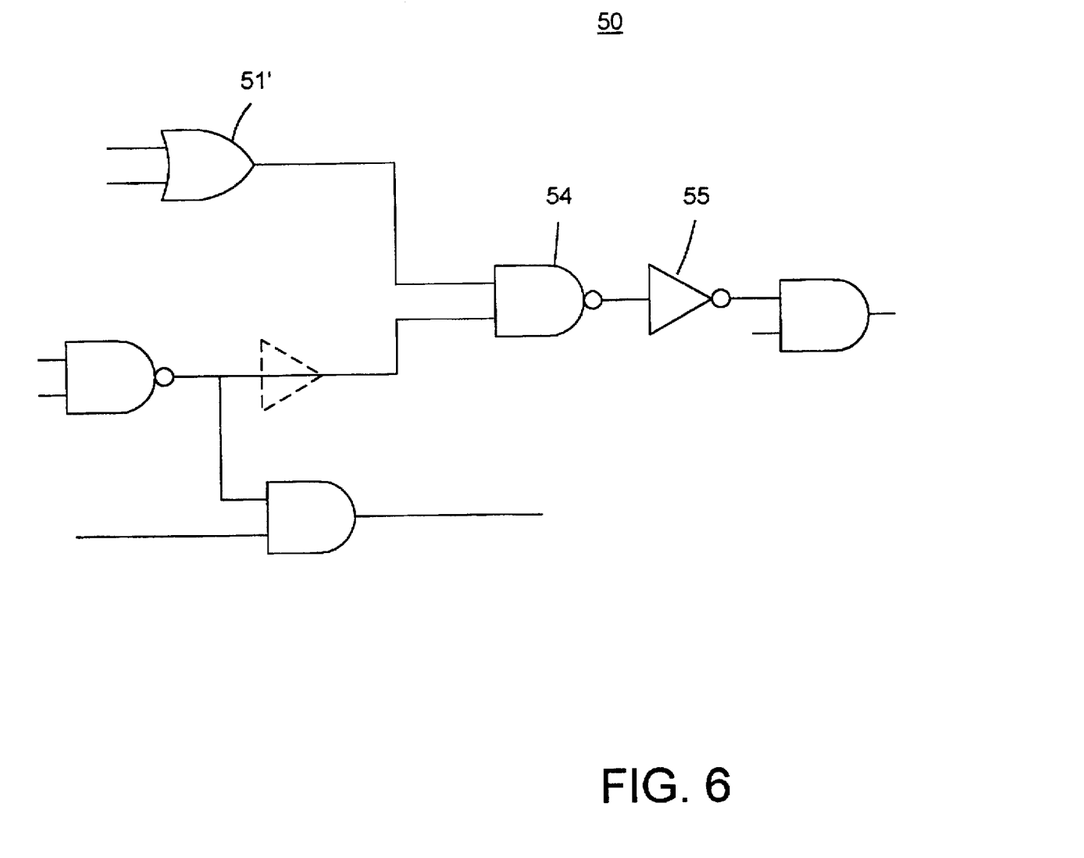
FIG. 6 is the logic circuit of FIG. 5 after the pseudo-buffer has been removed in accordance with a preferred embodiment of the present invention.

FIGS. 4–6 illustrate an example of the method and system described above. FIG. 4 depicts a logic circuit 50 that includes a buffer, an OR gate, a NAND gate and three AND gates. Of interest therein are OR gate 51, buffer 52 and AND gate 53. (The buffer 52 may have been inserted into circuit during a previous transformation for reasons eluded to above.) FIG. 5 depicts the same circuit after a new transformation. In FIG. 5, AND gate 53 has been converted into a NAND gate 54 and an inverter 55. During such an operation, OR gate 51 and buffer 52 will be repowered by the transformation to account for the gate capacitance changes caused by the transformation. Thus, a new OR gate 51' and buffer 52' must be chosen for the circuit by the repowering function. In accordance with the present invention, a pseudo-buffer will be a replacement choice for buffer 52. If repowering decides that the pseudo-buffer will provide optimal performance, it will be chosen to replace buffer 52. Because the pseudo-buffer is defined as a wire through which all electrical characteristics pass, it has no affect on the circuit and can be removed.(see FIG. 6).

Figure 7:
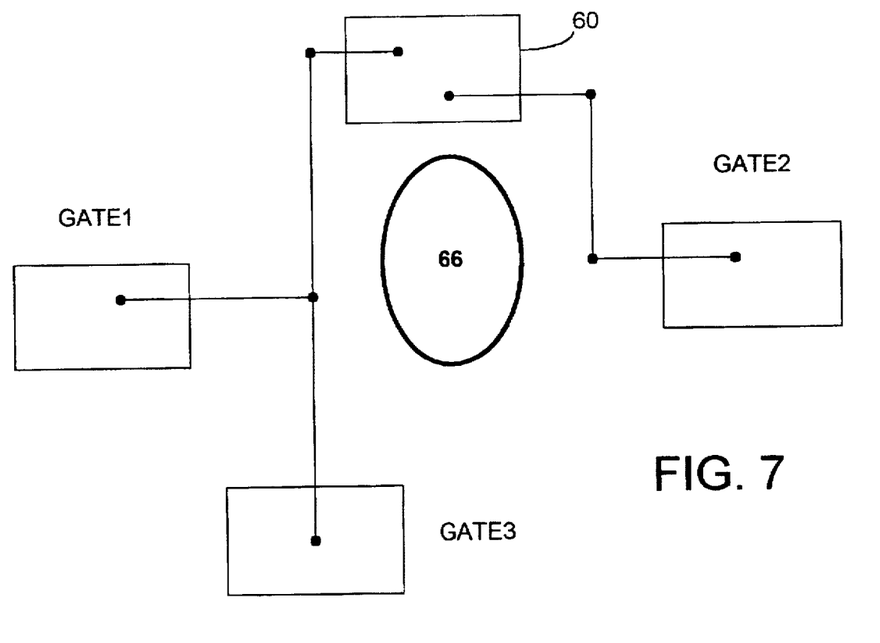
FIG. 7 depicts the physical layout of four gates including one buffer.
Figure 8:
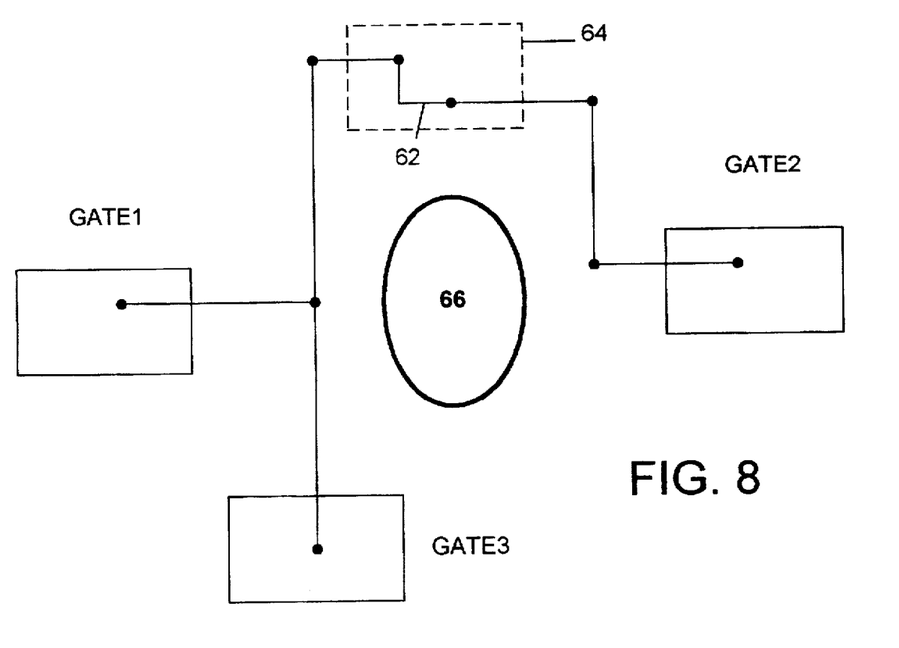
FIG. 8 is the layout of FIG. 7 after the buffer has been replaced by a pseudo-buffer and the pseudo-buffer has been removed in accordance with a preferred embodiment of this invention.

FIGS. 7–8 illustrate an example of the effect of this invention on the physical layout of the circuit. FIG. 7 depicts four gates (including one buffer 60) and the routing of the wires connecting the gates. FIG. 8 shows the same circuit after the buffer 60 has been replaced by a pseudo-buffer 64 and after the pseudo-buffer 64 has been removed. A wire 62 is added to connect the original buffer input and output pins.

As shown in FIGS. 7 and 8, an important feature of this invention is that the actual wire layout is preserved after routing. If the buffer of FIG. 7 was simply removed, routing would reroute the entire net and attempt to find a more direct route connecting the three remaining pins. This may not be possible due to the congestion in the central area. Without using the present implementation, the buffer would be removed outright along with all of the information and data associated with the original wires. Re-routing of the net would be required because buffer removal would cause the topology to be changed, and the original wire information and data would be unreliable. A new estimate of the wire length must then be generated for the remaining three gates. However, if rerouting cannot match this new estimate (e.g., the middle area 66 is congested and the net must be rerouted around the middle area 66), then the conclusion that removing the buffer improves timing may be wrong.

Using the present method and system, the pseudo-buffer is left in place so that capacitance and resistance information from the existing wires do not change. The removal of the pseudo-buffer is achieved by adding a small wire 62 between the original buffer pins. In accordance with this method and procedure, the netlist is still changed as before--sinks of the buffer are moved to the source net.

The embodiments and examples set forth herein were presented in order to best explain the present invention and its practical application and to thereby enable those skilled in the art to make and use the invention. However, those skilled in the art will recognize that the foregoing description and examples have been presented for the purposes of illustration and example only. The description as set forth is not intended to be exhausted or to limit the invention to the precise form disclosed. Many modifications and variations are possible in light of the above to teaching without departing from the spirit and scope of the following claims.

We claim:

1. A computer system comprising:
    a central processing unit;
    a bus;
    computer system memory, said computer system memory being connected to said central processing unit via said bus;
    a logic synthesis tool stored in said computer system memory and executable on said central processing unit, said logic synthesis tool having a repowering mechanism; and
    a technology library accessible by said logic synthesis tool, said technology library having a pseudo-buffer defined as a feedthrough.

2. The computer system of claim 1 wherein said pseudo-buffer is available as a replacement choice by said repowering mechanism.

3. The computer system of claim 1 wherein said pseudo-buffer is treated as a wire with no delay through which all electrical properties pass.

4. The computer system of claim 1 wherein said repowering mechanism includes a selection mechanism that chooses an optimal buffer design from said technology library for each buffer in a circuit design.

5. The computer system of claim 4 wherein said selection mechanism examines the size, speed and load capability of each buffer in said circuit design.

6. The computer system of claim 1 further comprising a pseudo-buffer removal mechanism.

7. The computer system of claim 1 further comprising a pseudo-buffer insertion mechanism.

8. The computer system of claim 7 wherein said repowering mechanism examines each pseudo-buffer and determines whether each pseudo-buffer should be replaced by a real buffer from said technology library.

9. The computer system of claim 6 wherein said pseudo-buffer removal mechanism includes a mechanism for leaving existing buffer wires in place and adding a wire between existing buffer pins.

10. A method of using a logic synthesis tool to eliminate unnecessary buffers in a logic circuit, said method comprising the steps of:

creating a pseudo-buffer for placement into a technology library of said logic synthesis tool wherein said pseudo-buffer is defined with a feedthrough delay rule such that said pseudo-buffer is treated as a wire with no delay;

adding said pseudo-buffer into said technology library wherein said pseudo-buffer is identified as a buffer cell with zero area;

running an existing timing and technology correction scenario on said logic circuit wherein said existing timing and technology correction scenario utilizes a repowering function that accesses said technology library and includes said pseudo-buffer as a replacement choice for each buffer in said logic circuit; and removing each pseudo-buffer from said logic circuit.

11. The method of claim 10 wherein each pseudo-buffer includes an input net and an output net, said output net including one or more sink.

12. The method of claim 11 wherein said step of removing each pseudo-buffer from said logic circuit is accomplished by moving all sinks on the output net to said input net, and disconnecting the psuedo-buffer from said input net.

13. The method of claim 10 wherein said repowering function examines each buffer and selects from said technology library an optimal buffer cell design.

14. The method of claim 13 wherein said step of selecting an optimal buffer cell design from said technology library includes a decision criteria that comprises size, speed and load capacity.

15. The method of claim 14 wherein said step of selecting an optimal buffer cell design from said technology library includes the step of considering said pseudo-buffer.

16. The method of claim 10 wherein said logic synthesis tool includes said feedthrough delay rule.

17. The method of claim 10 wherein said step of removing each pseudo-buffer from said logic circuit includes the steps of:

leaving existing buffer wires in place; and adding a new wire between a first and second original buffer pins.

18. A program product, said program product comprising:

a recordable media; and a logic synthesis tool recorded on said recordable media, said logic synthesis tool having a mechanism to model a feedthrough; and a technology library accessible by said logic synthesis tool, said technology library having a pseudo-buffer that is defined as a feedthrough.

19. The program product of claim 18 wherein said logic synthesis tool includes a repowering mechanism.

20. The program product of claim 18 further comprising a pseudo-buffer removal mechanism.

21. The program product of claim 18 further comprising a pseudo-buffer insertion mechanism.

22. A method of inserting buffers into a logic circuit with a logic synthesis tool having feedthrough modeling capabilities, said method comprising the steps of:

creating a pseudo-buffer for placement into a technology library accessible by said logic synthesis tool wherein said pseudo-buffer is defined as a feedthrough such that said pseudo-buffer is treated as a wire with no delay;

adding said pseudo-buffer into said technology library wherein said pseudo-buffer is identified as a buffer cell with zero area;

seeding said logic circuit design with a plurality of pseudo-buffers; and running an existing timing and technology correction scenario on said logic circuit wherein said existing timing and technology correction scenario utilizes a repowering function that examines each of said pseudo-buffers and determines whether each of said pseudo-buffers should be replaced by a real buffer from said technology library.

23. The method of claim 22 wherein said repowering function examines a plurality of buffer designs from said technology library and selects one with an optimal power level.

24. The method of claim 22 wherein said logic synthesis tool includes a feedthrough delay rule.

* * * * *